US010902165B2

(12) United States Patent
Delva

(10) Patent No.: US 10,902,165 B2
(45) Date of Patent: Jan. 26, 2021

(54) DEPLOYABLE DEVELOPMENT PLATFORM FOR AUTONOMOUS VEHICLE (DDPAV)

(71) Applicant: The Charles Stark Draper Laboratory, Inc., Cambridge, MA (US)

(72) Inventor: Justin Delva, Carlisle, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 481 days.

(21) Appl. No.: 15/865,813

(22) Filed: Jan. 9, 2018

(65) Prior Publication Data
US 2019/0213290 A1 Jul. 11, 2019

(51) Int. Cl.
*G05D 1/02* (2020.01)
*G05D 1/00* (2006.01)
*B60W 50/00* (2006.01)
*G06F 17/50* (2006.01)
(Continued)

(52) U.S. Cl.
CPC .......... *G06F 30/20* (2020.01); *B60W 50/00* (2013.01); *G05D 1/0088* (2013.01); *G05D 1/0214* (2013.01); *G06F 30/15* (2020.01); *G05D 2201/0213* (2013.01)

(58) Field of Classification Search
CPC ............ B60W 50/00; G05D 1/0088; G05D 2201/0213; G06F 30/15; G06F 30/20
See application file for complete search history.

(56) References Cited

U.S. PATENT DOCUMENTS

| | | | |
|---|---|---|---|
| 2017/0132118 A1* | 5/2017 | Stefan | G06F 11/3668 |
| 2017/0169623 A1* | 6/2017 | Chen | G07C 5/02 |
| 2017/0361856 A1* | 12/2017 | Fischer | B61L 27/0088 |

(Continued)

OTHER PUBLICATIONS

Mohon, S., et al. "Development of an Electric Vehicle Hardware-In-The-Loop Emulation Platform" Proceedings of the ASME 2013 International Design Engineering Technical Conference and Computers and Information Engineering Conference. Aug. 4-7, 2013.
(Continued)

*Primary Examiner* — Peter D Nolan
*Assistant Examiner* — Ce Li Li
(74) *Attorney, Agent, or Firm* — Hamilton, Brook, Smith & Reynolds, P.C.

(57) ABSTRACT

In an embodiment, a method for testing a highly-automated driving (HAD) vehicle includes simulating a testing environment. The testing environment includes objects, terrain(s), roadways, or conditions. The method further converts the objects to either a converted hardware object signal having synthetic analog signals, or a converted software object signal having synthetic digital signals, the synthetic signals emulating the objects of the testing environment. The method further either directs the converted hardware object signals to sensor hardware of the HAD vehicle, causing sensor hardware to perceive the objects of the testing environment emulated by the converted hardware object signals, or directs the converted software object signals to a signal processing unit of the HAD vehicle. The method further provides outputs of systems of the DP processing the directed converted object signals to the testing environment to further simulate iterations of the testing environment by applying the outputs to the testing environment.

20 Claims, 14 Drawing Sheets

(51) Int. Cl.
    *G06F 30/20*    (2020.01)
    *G06F 30/15*    (2020.01)

(56) References Cited

U.S. PATENT DOCUMENTS

| | | | | |
|---|---|---|---|---|
| 2018/0060725 A1* | 3/2018 | Groh | ................... | G06N 7/005 |
| 2018/0275658 A1* | 9/2018 | Iandola | ............... | G06K 9/6268 |
| 2018/0308296 A1* | 10/2018 | Dan | ...................... | G07C 5/008 |
| 2019/0041294 A1* | 2/2019 | Tideman | ............ | G01M 17/007 |
| 2019/0182136 A1* | 6/2019 | Tamm | .................. | H04L 41/145 |
| 2020/0065443 A1* | 2/2020 | Liu | ...................... | G06Q 40/08 |

OTHER PUBLICATIONS

Complete Automotive Electrical System Design, R. Juchem & B. Knorr; IEEE 2003 Vehicular Technology Conference; pp. 3262-3266.

Arai, K., et al. "Mechanical and Electrical Co-simulation Technology for In-Vehical Power Systems", SEI Technical Review, No. 84, pp. 120-124, Apr. 2017.

Metz, C., "What Virtual Reality Can Teach a Driverless Car"— retrieved from Internet Nov. 13, 2017. https://www.nytimes.com/2017/10/29/business/virtual-reality-driverless-cars.html?action=click&module=Discovery&pgtype=Homepage Retrieved from Internet Nov. 13, 2017.

* cited by examiner

1000

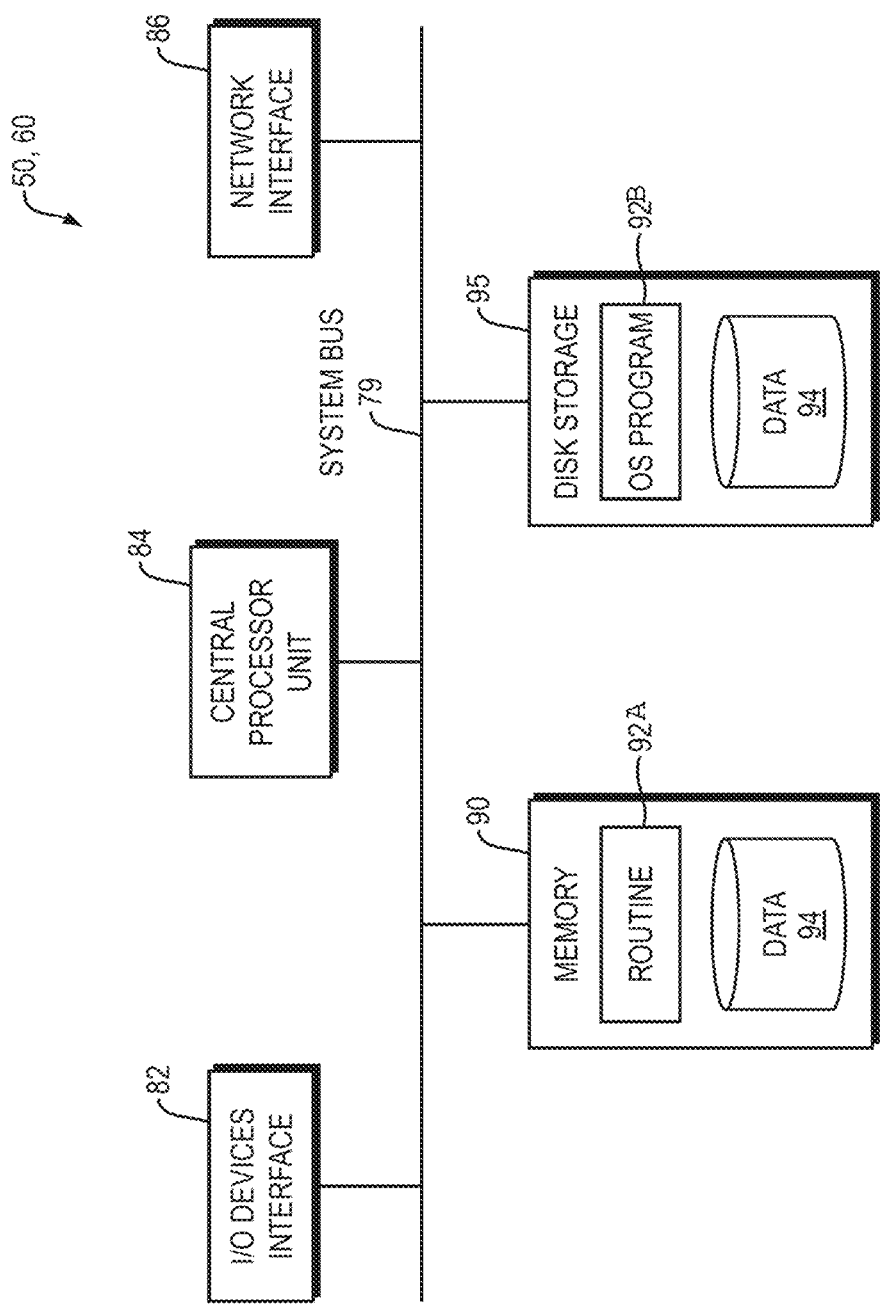

DEPLOYABLE DEVELOPMENT PLATFORM FOR AUTONOMOUS VEHICLE (DDPAV)

BACKGROUND

Highly autonomous driving (HAD) vehicles utilize sensors to sense the outside world and automate many functions of driving, including steering, acceleration, and braking. A form of highly autonomous driving includes fully autonomous driving that does not require human intervention. In either form, HAD uses signal processing, navigation, localization, steering, and other methods and techniques.

SUMMARY

For safe HAD, these methods and techniques should be thoroughly tested and vetted. Simulated testing can be an important stage of such tests. Simulated testing provides multiple advantages, including (1) testing multiple scenarios simultaneously, (2) protecting expensive prototype vehicles, (3) detecting bugs before a prototype is on the road, (4) generation of specific scenarios that a road test may not encounter easily. Therefore, a robust simulated testing system is integral to the development and design of HAD vehicles.

In an embodiment, a method for testing a highly-automated driving (HAD) vehicle includes simulating a testing environment, by one or more processors. The testing environment may include objects, terrain(s), roadways, and road conditions. The method further includes converting, by the processors, the objects of the testing environment to converted object signals. The converted object signals may include either:

a converted hardware object signal having synthetic analog signals emulating objects of the testing environment, or a converted software object signal having synthetic digital signals emulating the objects of the testing environment.

The method further includes directing the converted object signals to a development platform (DP) emulating systems of the HAD vehicle by either:

directing the converted hardware object signals to sensor hardware of the HAD vehicle, which causes the sensor hardware to perceive the objects of the testing environment emulated by the converted hardware object signals, or directing the converted software object signals to at least one signal processing unit of the HAD vehicle.

The method further includes providing outputs of systems of the DP processing the directed converted object signals to the testing environment to further simulate iterations of the testing environment, at the one or more processors, by applying the outputs to the testing environment.

In an embodiment, converting the objects of the testing environment to converted signals further includes converted object signals including electrical/mechanical (E/M) emulation signals. Directing the converted hardware object signals to systems of the DP further includes directing the converted E/M signals to an electro/mechanical emulator.

In an embodiment, directing the converted hardware object signals to sensor hardware of the DP further includes bypassing a sensor of the sensor hardware to provide physics-based synthetic data to the sensor hardware.

In an embodiment, directing the converted software object signals to the signal processing units of the DP bypasses the sensor hardware.

In an embodiment, a multiplexer chooses between a type of converted object signals to send to the signal processing units.

In an embodiment, the method includes generating a display of the testing environment. The display is a real-time video of a highly-autonomous vehicle of the DP under test and the testing environment.

In an embodiment, simulating includes simulating a plurality of testing environments, converting includes converting the objects of the testing environment to converted object signals for each of the plurality of testing environments, and directing includes directing the converted object signals to a respective DP of a plurality of DPs.

In an embodiment, the analog signals are radio frequency (RF) signals.

In an embodiment, the one or more processors are graphical processing units (GPUs).

In an embodiment, a system for testing a highly-automated driving (HAD) vehicle includes a processor and a memory with computer code instructions stored therein. The memory is operatively coupled to said processor such that the computer code instructions configure the processor to implement simulating a testing environment. The testing environment includes a plurality of objects, terrain, roadways, and road conditions. The processor further implements converting the objects of the testing environment to converted object signals. The converted object signals may include either:

a converted hardware object signal having synthetic analog signals emulating objects of the testing environment, or a converted software object signal having synthetic digital signals emulating objects of the testing environment.

The system further directs the converted object signals to a development platform (DP) emulating systems of the HAD vehicle by either:

directing the converted hardware object signals to sensor hardware of the HAD vehicle, causing the sensor hardware to perceive the objects of the testing environment emulated by the converted hardware object signals, or directing the converted software object signals to at least one signal processing units of the HAD vehicle.

The system further provides outputs of systems of the DP processing the directed converted object signals to the testing environment to further simulate iterations of the testing environment by applying the outputs to the testing environment.

In an embodiment, a non-transitory computer-readable medium is configured to store instructions for testing a highly-automated driving (HAD) vehicle. The instructions, when loaded and executed by a processor, cause the processor to simulate a testing environment. The testing environment includes a plurality of objects, terrain, roadways, and road conditions. The instructions further cause the processor to convert the objects of the testing environment to converted object signals, the converted object signals comprising either:

a converted hardware object signal having synthetic analog signals emulating objects of the testing environment, or a converted software object signal having synthetic digital signals emulating the objects of the testing environment.

The instructions further cause the processor to direct the converted object signals to a development platform (DP) emulating systems of the HAD vehicle by either:

directing the converted hardware object signals to sensor hardware of the HAD vehicle, causing the sensor hardware to perceive the objects of the testing environment emulated by the converted hardware object signals, or directing the converted software object signals to signal processing units of the HAD vehicle.

The instructions further provide outputs of systems of the DP processing the directed converted object signals to the testing environment to further simulate iterations of the testing environment by applying the outputs to the testing environment.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 14 is a diagram of an example internal structure of a computer (e.g., client processor/device or server computers) in the computer system of FIG. 13.

DETAILED DESCRIPTION

A description of example embodiments follows.

In an embodiment of the Applicant's method and system, a Development Platform for Autonomous Vehicle(s) (DPAV) (or Deployable Development Platform for Autonomous Vehicle(s) (DDPAV) or Development Platform (DP)) is provided. The DPAV provides a real-time virtual environment to test or debug autonomous vehicle systems and methods. Such a real-time virtual environment reduces or eliminates the need for exhaustive and costly road-tests. The DPAV further can perform regression tests at computational speed limits. The DPAV further models the autonomous vehicle's electrical/mechanical systems in simulations.

As the DPAV is a real-time virtual environment to test or debug autonomous vehicle systems, it interfaces with architectures and respective systems of these autonomous vehicle systems. Therefore, before describing details of the DPAV, a description of such an autonomous vehicle architecture is provided in FIGS. 1-5.

Figure 1:
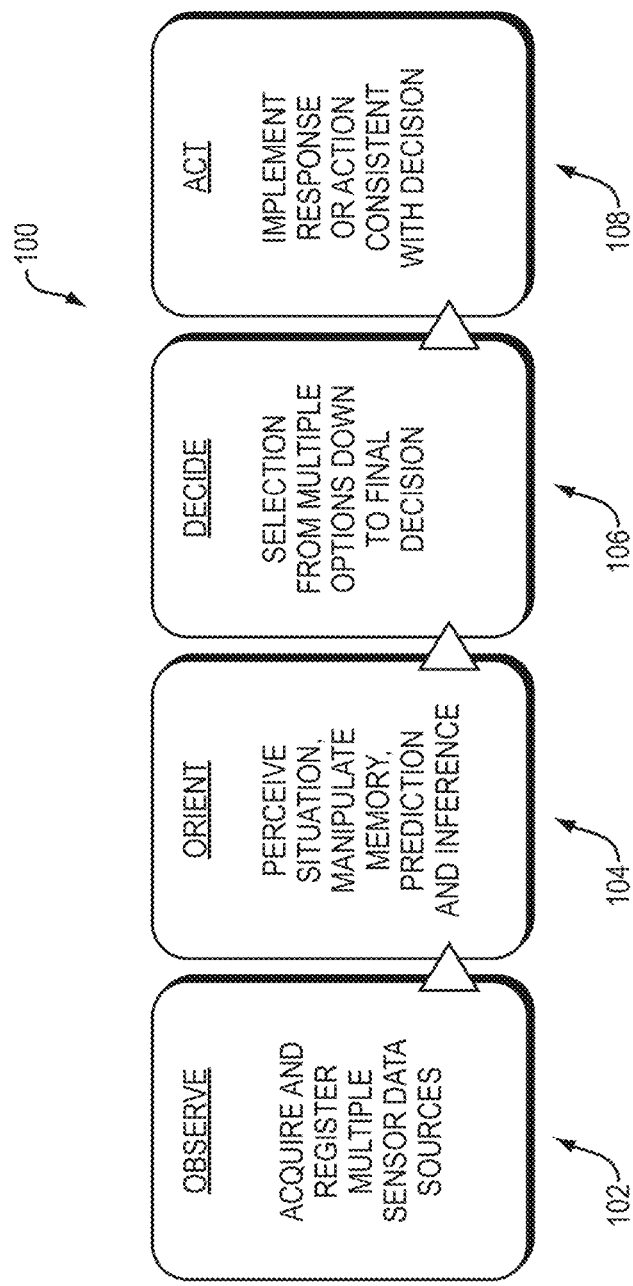
FIG. 1 is a diagram illustrating steps in an embodiment of an automated control system of the Observe, Orient, Decide, and Act (OODA) model.
Figure 2:
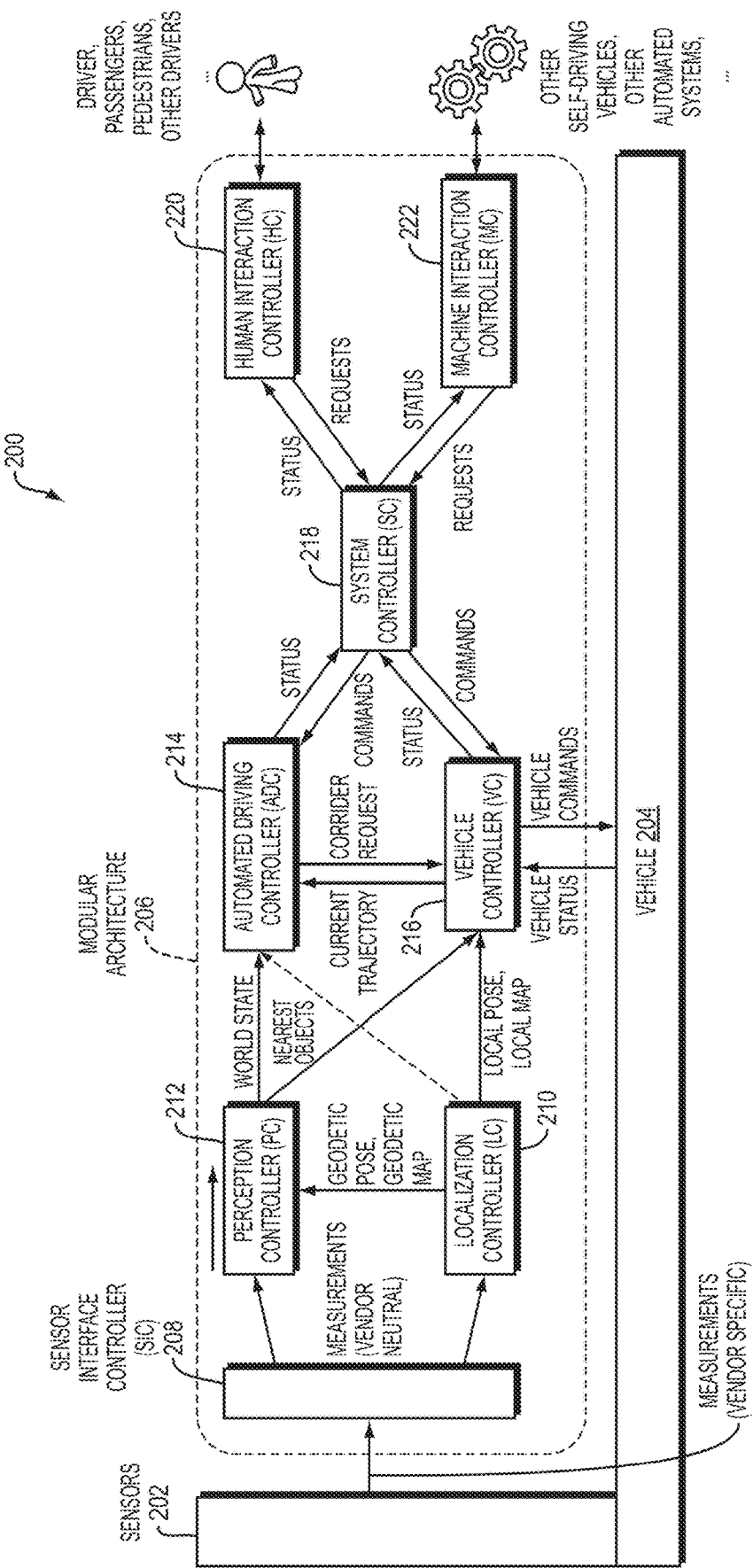
FIG. 2 is a block diagram of an embodiment of an autonomous vehicle high-level architecture.

FIG. 1 is a diagram illustrating steps in an embodiment of an automated control system of the Observe, Orient, Decide, and Act (OODA) model. Automated systems, such as highly-automated driving systems, or, self-driving cars, or autonomous vehicles, employ an OODA model. The observe virtual layer 102 involves sensing features from the world using machine sensors, such as laser ranging, radar, infrared, vision systems, or other systems. The orientation virtual layer 104 involves perceiving situational awareness based on the sensed information. Examples of orientation virtual layer activities are Kalman filtering, model based matching, machine or deep learning, and Bayesian predictions. The decide virtual layer 106 selects an action from multiple objects to a final decision. The act virtual layer 108 provides guidance and control for executing the decision. FIG. 2 is a block diagram 200 of an embodiment of an autonomous vehicle high-level architecture 206. The architecture 206 is built using a top-down approach to enable fully automated driving. Further, the architecture 206 is preferably modular such that it can be adaptable with hardware from different vehicle manufacturers. The architecture 206, therefore, has several modular elements functionally divided to maximize these properties. In an embodiment, the modular architecture 206 described herein can interface with sensor systems 202 of any vehicle 204. Further, the modular architecture 206 can receive vehicle information from and communicate with any vehicle 204.

Elements of the modular architecture 206 include sensors 202, Sensor Interface Controller (SIC) 208, localization controller (LC) 210, perception controller (PC) 212, automated driving controller 214 (ADC), vehicle controller 216 (VC), system controller 218 (SC), human interaction controller 220 (HC) and machine interaction controller 222 (MC).

Referring again to the OODA model of FIG. 1, in terms of an autonomous vehicle, the observation layer of the model includes gathering sensor readings, for example, from vision sensors, Radar (Radio Detection And Ranging), LIDAR (Light Detection And Ranging), and Global Positioning Systems (GPS). The sensors 202 shown in FIG. 2 show such an observation layer. Examples of the orientation layer of the model can include determining where a car is relative to the world, relative to the road it is driving on, and relative to lane markings on the road, shown by Perception Controller (PC) 212 and Localization Controller (LC) 210 of FIG. 2. Examples of the decision layer of the model include determining a corridor to automatically drive the car, and include elements such as the Automatic Driving Controller (ADC) 214 and Vehicle Controller (VC) 216 of FIG. 2. Examples of the act layer include converting that corridor into commands to the vehicle's driving systems (e.g., steering sub-system, acceleration sub-system, and breaking sub-system) that direct the car along the corridor, such as actuator control 410 of FIG. 4. A person of ordinary skill in the art can recognize that the layers of the system are not strictly sequential, and as observations change, so do the results of the other layers. For example, after the system chooses a corridor to drive in, changing conditions on the road, such as detection of another object, may direct the car to modify its corridor, or enact emergency procedures to prevent a collision. Further, the commands of the vehicle controller may need to be adjusted dynamically to compensate for drift, skidding, or other changes to expected vehicle behavior.

At a high level, the module architecture 206 receives measurements from sensors 202. While different sensors may output different sets of information in different formats, the modular architecture 206 includes Sensor Interface Controller (SIC) 208, sometimes also referred to as a Sensor Interface Server (SIS), configured to translate the sensor data into data having a vendor-neutral format that can be read by the modular architecture 206. Therefore, the modular architecture 206 learns about the environment around the vehicle 204 from the vehicle's sensors, no matter the vendor, manufacturer, or configuration of the sensors. The SIS 208 can further tag each sensor's data with a metadata tag having its location and orientation in the car, which can be used by the perception controller to determine the unique angle, perspective, and blind spot of each sensor.

Further, the modular architecture 206 includes vehicle controller 216 (VC). The VC 216 is configured to send commands to the vehicle and receive status messages from the vehicle. The vehicle controller 216 receives status messages from the vehicle 204 indicating the vehicle's status, such as information regarding the vehicle's speed, attitude, steering position, braking status, and fuel level, or any other information about the vehicle's subsystems that is relevant for autonomous driving. The modular architecture 206, based on the information from the vehicle 204 and the sensors 202, therefore can calculate commands to send from the VC 216 to the vehicle 204 to implement self-driving. The functions of the various modules within the modular architecture 206 are described in further detail below. However, when viewing the modular architecture 206 at a high level, it receives (a) sensor information from the sensors 202 and (b) vehicle status information from the vehicle 204, and in turn, provides the vehicle instructions to the vehicle 204. Such an architecture allows the modular architecture to be employed for any vehicle with any sensor configuration. Therefore, any vehicle platform that includes a sensor subsystem (e.g., sensors 202) and an actuation subsystem having the ability to provide vehicle status and accept driving commands (e.g., actuator control 410 of FIG. 4) can integrate with the modular architecture 206.

Within the modular architecture 206, various modules work together to implement automated driving according to the OODA model. The sensors 202 and SIC 208 reside in the "observe" virtual layer. As described above, the SIC 208 receives measurements (e.g., sensor data) having various formats. The SIC 208 is configured to convert vendor-specific data directly from the sensors to vendor-neutral data. In this way, the set of sensors 202 can include any brand of Radar, LIDAR, image sensor, or other sensors, and the modular architecture 206 can use their perceptions of the environment effectively.

Figure 3:
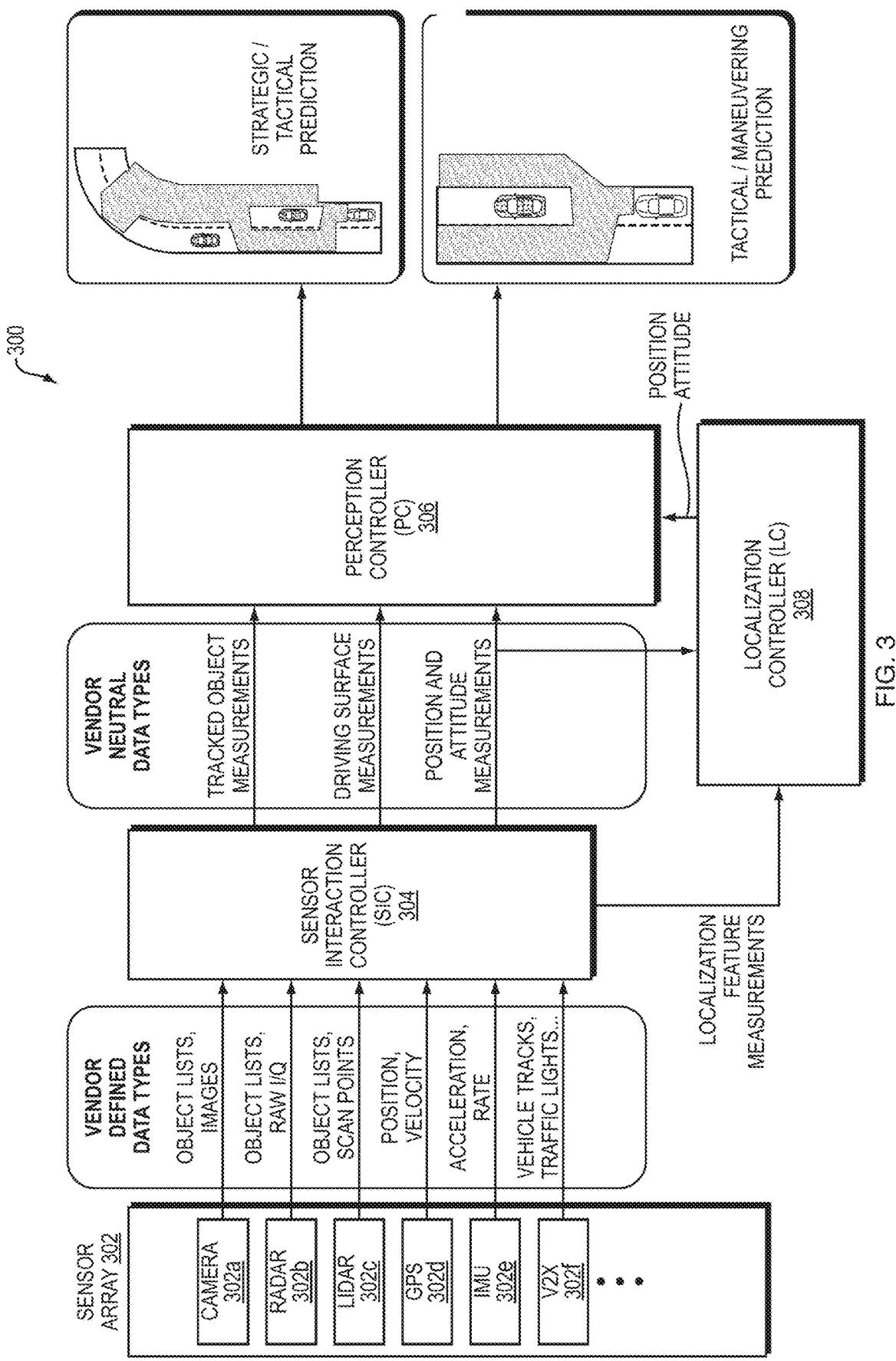
FIG. 3 is a block diagram illustrating an embodiment of the sensor interaction controller (SIC), perception controller (PC), and localization controller (LC).

The measurements output by the sensor interface server are then processed by perception controller (PC) 212 and localization controller (LC) 210. The PC 212 and LC 210 both reside in the "orient" virtual layer of the OODA model. The LC 210 determines a robust world-location of the vehicle that can be more precise than a GPS signal, and still determines the world-location of the vehicle when there is no available or an inaccurate GPS signal. The LC 210 determines the location based on GPS data and sensor data. The PC 212, on the other hand, generates prediction models representing a state of the environment around the car, including objects around the car and state of the road. FIG. 3 provides further details regarding the SIC 208, LC 210 and PC 212.

Figure 4:
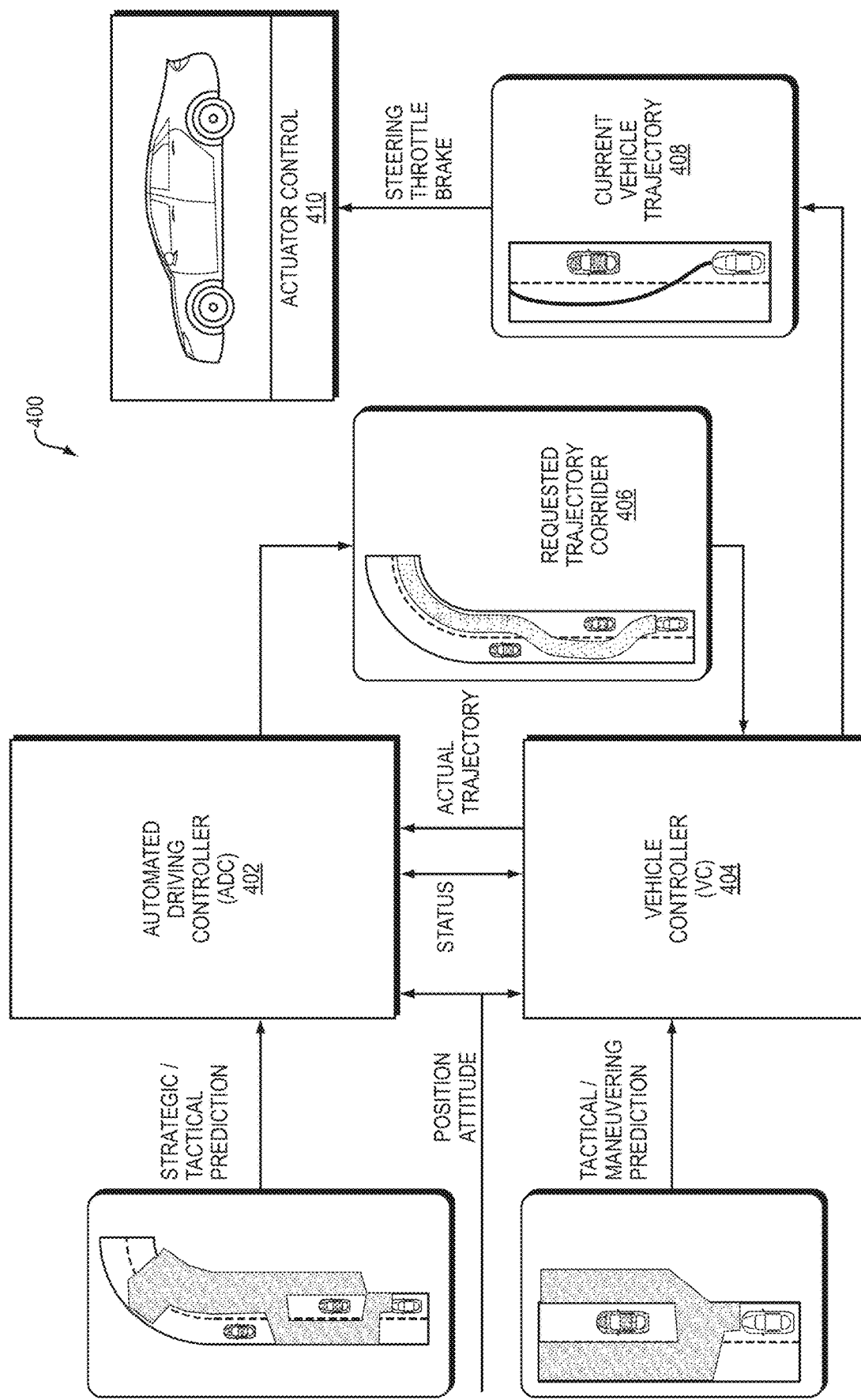
FIG. 4 is a block diagram illustrating an example embodiment of the automatic driving controller (ADC), vehicle controller (VC) and actuator controller.

Automated driving controller 214 (ADC) and vehicle controller 216 (VC) receive the outputs of the perception controller and localization controller. The ADC 214 and VC 216 reside in the "decide" virtual layer of the OODA model. The ADC 214 is responsible for destination selection, route and lane guidance, and high-level traffic surveillance. The ADC 214 further is responsible for lane selection within the route, and identification of safe harbor areas to diver the vehicle in case of an emergency. In other words, the ADC 214 selects a route to reach the destination, and a corridor within the route to direct the vehicle. The ADC 214 passes this corridor onto the VC 216. Given the corridor, the VC 216 provides a trajectory and lower level driving functions to direct the vehicle through the corridor safely. The VC 216 first determines the best trajectory to maneuver through the corridor while providing comfort to the driver, an ability to reach safe harbor, emergency maneuverability, and ability to follow the vehicle's current trajectory. In emergency situations, the VC 216 overrides the corridor provided by the ADC 214 and immediately guides the car into a safe harbor corridor, returning to the corridor provided by the ADC 214 when it is safe to do so. The VC 216, after determining how to maneuver the vehicle, including safety maneuvers, then provides actuation commands to the vehicle 204, which executes the commands in its steering, throttle, and braking subsystems. This element of the VC 216 is therefore in the "act" virtual layer of the CODA model. FIG. 4 describes the ADC 214 and VC 216 in further detail.

The modular architecture 206 further coordinates communication with various modules through system controller 218 (SC). By exchanging messages with the ADC 214 and VC 216, the SC 218 enables operation of human interaction controller 220 (HC) and machine interaction controller 222 (MC). The HC 220 provides information about the autonomous vehicle's operation in a human understandable format based on status messages coordinated by the system controller. The HC 220 further allows for human input to be factored into the car's decisions. For example, the HC 220 enables the operator of the vehicle to enter or modify the destination or route of the vehicle, as one example. The SC 218 interprets the operator's input and relays the information to the VC 216 or ADC 214 as necessary.

Figure 6:
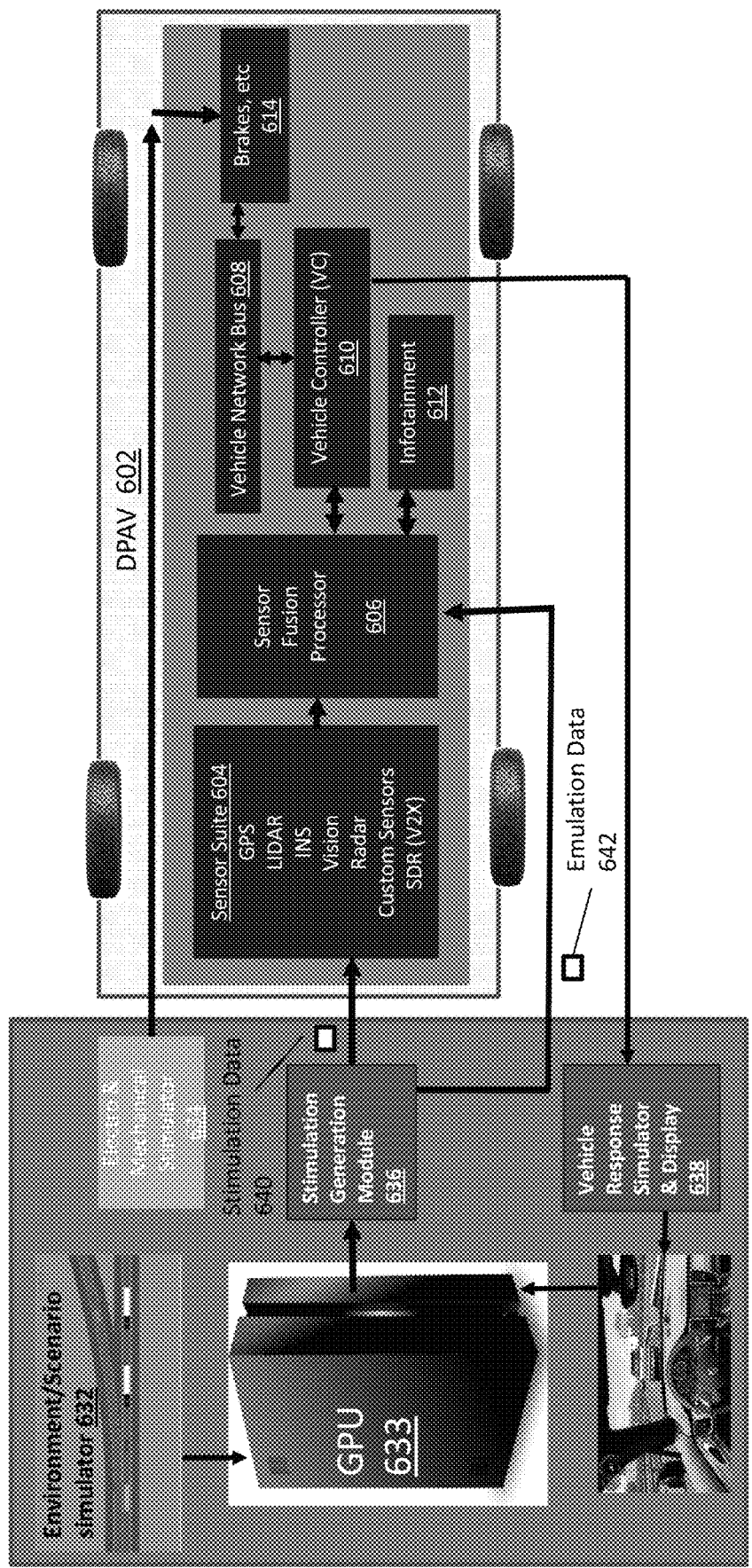
FIG. 6 is a block diagram illustrating an example embodiment of a testing environment of a Deployable Platform for Autonomous Vehicle (DPAV) connected to a communications and sensor stimulation server.

Further, the MC 222 can coordinate messages with other machines or vehicles. For example, other vehicles can electronically and wirelessly transmit route intentions, intended corridors of travel, and sensed objects that may be in other vehicle's blind spot to autonomous vehicles, and the MC 222 can receive such information, and relay it to the VC 216 and ADC 214 via the SC 218. In addition, the MC 222 can send information to other vehicles wirelessly. In the example of a turn signal, the MC 222 can receive a notification that the vehicle intends to turn. The MC 222 receives this information via the VC 216 sending a status message to the SC 218, which relays the status to the MC 222. However, other examples of machine communication can also be implemented. For example, other vehicle sensor information or stationary sensors can wirelessly send data to the autonomous vehicle, giving the vehicle a more robust view of the environment. Other machines may be able to transmit information about objects in the vehicles blind spot, for example. In further examples, other vehicles can send their vehicle track. In an even further examples, traffic lights can send a digital signal of their status to aid in the case where the traffic light is not visible to the vehicle. A person of ordinary skill in the art can recognize that any information employed by the autonomous vehicle can also be transmitted to or received from other vehicles to aid in autonomous driving. FIG. 6 shows the HC 220, MC 222, and SC 218 in further detail.

FIG. 3 is a block diagram 300 illustrating an embodiment of the sensor interaction controller 304 (SIC), perception controller (PC) 306, and localization controller (LC) 308. A sensor array 302 of the vehicle can include various types of sensors, such as a camera 302a, radar 302b, LIDAR 302c, GPS 302d, IMU 302e, or vehicle-to-everything (V2X) 302f. Each sensor sends individual vendor defined data types to the SIC 304. For example, the camera 302a sends object lists and images, the radar 302b sends object lists, and in-phase/quadrature (IQ) data, the LIDAR 302c sends object lists and scan points, the GPS 302d sends position and velocity, the IMU 302e sends acceleration data, and the V2X 302f controller sends tracks of other vehicles, turn signals, other sensor data, or traffic light data. A person of ordinary skill in the art can recognize that the sensor array 302 can employ other types of sensors, however. The SIC 304 monitors and diagnoses faults at each of the sensors 302a-f. In addition, the SIC 304 isolates the data from each sensor from its vendor specific package and sends vendor neutral data types to the perception controller (PC) 306 and localization controller 308 (LC). The SIC 304 forwards localization feature measurements and position and attitude measurements to the LC 308, and forwards tracked object measurements, driving surface measurements, and position & attitude measurements to the PC 306. The SIC 304 can further be updated with firmware so that new sensors having different formats can be used with the same modular architecture.

The LC 308 fuses GPS and IMU data with Radar, Lidar, and Vision data to determine a vehicle location, velocity, and attitude with more precision than GPS can provide alone. The LC 308 then reports that robustly determined location, velocity, and attitude to the PC 306. The LC 308 further monitors measurements representing position, velocity, and attitude data for accuracy relative to each other, such that if one sensor measurement fails or becomes degraded, such as a GPS signal in a city, the LC 308 can correct for it. The PC 306 identifies and locates objects around the vehicle based on the sensed information. The PC 306 further estimates drivable surface regions surrounding the vehicle, and further estimates other surfaces such as road shoulders or drivable terrain in the case of an emergency. The PC 306 further provides a stochastic prediction of future locations of objects. The PC 306 further stores a history of objects and drivable surfaces.

The PC 306 outputs two predictions, a strategic prediction, and a tactical prediction. The tactical prediction represents the world around 2-4 seconds into the future, which only predicts the nearest traffic and road to the vehicle. This prediction includes a free space harbor on shoulder of the road or other location. This tactical prediction is based entirely on measurements from sensors on the vehicle of nearest traffic and road conditions.

The strategic prediction is a long term prediction that predicts areas of the car's visible environment beyond the visible range of the sensors. This prediction is for greater than four seconds into the future, but has a higher uncertainty than the tactical prediction because objects (e.g., cars and people) may change their currently observed behavior in an unanticipated manner. Such a prediction can also be based on sensor measurements from external sources including other autonomous vehicles, manual vehicles with a sensor system and sensor communication network, sensors positioned near or on the roadway or received over a network from transponders on the objects, and traffic lights, signs, or other signals configured to communicate wirelessly with the autonomous vehicle.

FIG. 4 is a block diagram 400 illustrating an example embodiment of the automatic driving controller (ADC) 402, vehicle controller (VC) 404 and actuator controller 410. The ADC 402 and VC 404 execute the "decide" virtual layer of the CODA model.

The ADC 402, based on destination input by the operator and current position, first creates an overall route from the current position to the destination including a list of roads and junctions between roads in order to reach the destination. This strategic route plan may be based on traffic conditions, and can change based on updating traffic conditions, however such changes are generally enforced for large changes in estimated time of arrival (ETA). Next, the ADC 402 plans a safe, collision-free, corridor for the autonomous vehicle to drive through based on the surrounding objects and permissible drivable surface—both supplied by the PC. This corridor is continuously sent as a request to the VC 404 and is updated as traffic and other conditions change. The VC 404 receives the updates to the corridor in real time. The ADC 402 receives back from the VC 404 the current actual trajectory of the vehicle, which is also used to modify the next planned update to the driving corridor request.

The ADC 402 generates a strategic corridor for the vehicle to navigate. The ADC 402 generates the corridor based on predictions of the free space on the road in the strategic/tactical prediction. The ADC 402 further receives the vehicle position information and vehicle attitude information from the perception controller of FIG. 3. The VC 404 further provides the ADC 402 with an actual trajectory of the vehicle from the vehicle's actuator control 410. Based on this information, the ADC 402 calculates feasible corridors to drive the road, or any drivable surface. In the example of being on an empty road, the corridor may follow the lane ahead of the car.

In another example of the car needing to pass out a car, the ADC 402 can determine whether there is free space in a passing lane and in front of the car to safely execute the pass. The ADC 402 can automatically calculate based on (a) the current distance to the car to be passed, (b) amount of drivable road space available in the passing lane, (c) amount of free space in front of the car to be passed, (d) speed of the vehicle to be passed, (e) current speed of the autonomous vehicle, and (f) known acceleration of the autonomous vehicle, a corridor for the vehicle to travel through to execute the pass maneuver.

In another example, the ADC 402 can determine a corridor to switch lanes when approaching a highway exit. In addition to all of the above factors, the ADC 402 monitors the planned route to the destination and, upon approaching a junction, calculates the best corridor to safely and legally continue on the planned route.

The ADC 402 the provides the requested corridor 406 to the VC 404, which works in tandem with the ADC 402 to allow the vehicle to navigate the corridor. The requested corridor 406 places geometric and velocity constraints on any planned trajectories for a number of seconds into the future. The VC 404 determines a trajectory to maneuver within the corridor 406. The VC 404 bases its maneuvering decisions from the tactical/maneuvering prediction received from the perception controller and the position of the vehicle and the attitude of the vehicle. As described previously, the tactical/maneuvering prediction is for a shorter time period, but has less uncertainty. Therefore, for lower-level maneuvering and safety calculations, the VC 404 effectively uses the tactical/maneuvering prediction to plan collision-free trajectories within requested corridor 406. As needed in emergency situations, the VC 404 plans trajectories outside the corridor 406 to avoid collisions with other objects.

The VC 404 then determines, based on the requested corridor 406, the current velocity and acceleration of the car, and the nearest objects, how to drive the car through that corridor 406 while avoiding collisions with objects and remain on the drivable surface. The VC 404 calculates a tactical trajectory within the corridor, which allows the vehicle to maintain a safe separation between objects. The tactical trajectory also includes a backup safe harbor trajectory in the case of an emergency, such as a vehicle unexpectedly decelerating or stopping, or another vehicle swerving in front of the autonomous vehicle.

As necessary to avoid collisions, the VC 404 may be required to command a maneuver suddenly outside of the requested corridor from the ADC 402. This emergency maneuver can be initiated entirely by the VC 404 as it has faster response times than the ADC 402 to imminent collision threats. This capability isolates the safety critical collision avoidance responsibility within the VC 404. The VC 404 sends maneuvering commands to the actuators that control steering, throttling, and braking of the vehicle platform.

The VC 404 executes its maneuvering strategy by sending a current vehicle trajectory 408 having driving commands (e.g., steering, throttle, braking) to the vehicle's actuator controls 410. The vehicle's actuator controls 410 apply the commands to the car's respective steering, throttle, and braking systems. The VC 404 sending the trajectory 408 to the actuator controls represent the "Act" virtual layer of the CODA model. By conceptualizing the autonomous vehicle architecture in this way, the VC is the only component needing configuration to control a specific model of car (e.g., format of each command, acceleration performance, turning performance, and braking performance), whereas the ADC remaining highly agnostic to the specific vehicle capacities. In an example, the VC 404 can be updated with firmware configured to allow interfacing with particular vehicle's actuator control systems, or a fleet-wide firmware update for all vehicles.

Figure 5:
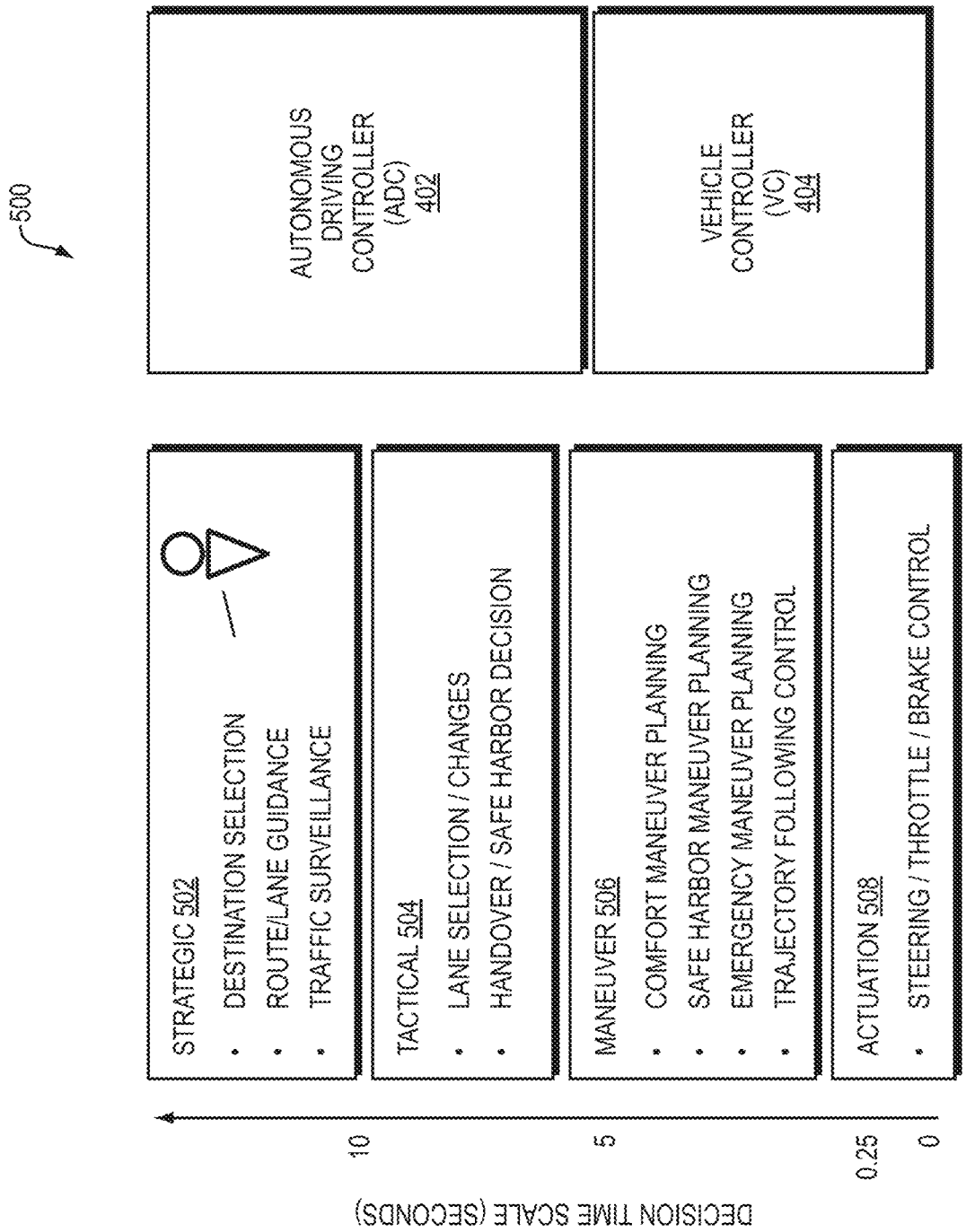
FIG. 5 is a diagram illustrating decision time scales of the ADC and VC.

FIG. 5 is a diagram 500 illustrating decision time scales of the ADC 402 and VC 404. The ADC 402 implements higher-level, strategic 502 and tactical 504 decisions by generating the corridor. The ADC 402 therefore implements the decisions having a longer range/or time scale. The estimate of world state used by the ADC 402 for planning strategic routes and tactical driving corridors for behaviors such as passing or making turns has higher uncertainty, but predicts longer into the future, which is necessary for planning these autonomous actions. The strategic predictions have high uncertainty because they predict beyond the sensor's visible range, relying solely on non-vision technologies, such as Radar, for predictions of objects far away from the car, that events can change quickly due to, for example, a human suddenly changing his or her behavior, or the lack of visibility of objects beyond the visible range of the sensors. Many tactical decisions, such as passing a car at highway speed, require perception Beyond the Visible Range (BVR) of an autonomous vehicle (e.g., 100 m or greater), whereas all maneuverability 506 decisions are made based on locally perceived objects to avoid collisions.

The VC 404, on the other hand, generates maneuverability decisions 506 using maneuverability predictions that are short time frame/range predictions of object behaviors and the driving surface. These maneuverability predictions have a lower uncertainty because of the shorter time scale of the predictions, however, they rely solely on measurements taken within visible range of the sensors on the autonomous vehicle. Therefore, the VC 404 uses these maneuverability predictions (or estimates) of the state of the environment immediately around the car for fast response planning of collision-free trajectories for the autonomous vehicle. The VC 402 issues actuation commands, on the lowest end of the time scale, representing the execution of the already planned corridor and maneuvering through the corridor.

The DPAV allows for testing, simulation, and debugging of such an autonomous vehicle. The DPAV allows sensor simulation or emulation of the autonomous vehicle with two operation modes, called Hardware-in-the-Loop (HWiL) and Software-in-the-Loop (SWiL). In HWiL, synthetic data is fed directly into a respective sensor's input to emulate signals from environment for that sensor. The sensor's hardware then processes the synthetic data to produce a sensor output. In SWiL, synthetic data emulates output of the sensors and bypasses the sensor hardware. The synthetic data is sent directly for processing to the autonomous vehicle's analytics modules.

Autonomous vehicles are described in further detail in "Autonomous Vehicle: Object-Level Fusion," U.S. patent applicatio Ser. No. 15/280,291 by Graham et al., "Autonomous Vehicle: Vehicle Localization," U.S. patent Ser. No. 15/280,296 by DiBitetto et al., and "Autonomous Vehicle: Modular Architecture," U.S. patent Ser. No. 15/280,454 by Jones et al. The entire teachings of the above applications are incorporated herein by reference.

FIG. 6 is a block diagram 600 illustrating an example embodiment of a testing environment of a Deployable Platform for Autonomous Vehicle (DPAV) 602 connected to a communications and sensor stimulator server 630.

The sensor and communications stimulator server 630 generates an environment to the DVAP 602 by generating sensor stimulations or emulations. An environment/scenario simulator 632 generates a real-life traffic simulation using a graphical processing unit (GPU) 633. A person of ordinary skill in the art can recognize that traditional processors, as opposed to GPUs, can also be used. A stimulation generation module 636 then converts objects of the generated environment into sensor and communications stimulation for various sensors and processing systems.

For purposes of this application, simulation refers to the generation of a real-life traffic simulation having real-life traffic situations. For example, a simulation can be a three-dimensional environment of the vehicle under test, including locations, movement vectors, accelerations, and other simulated characteristics of the vehicle under test. Other objects, such as objects, terrain, roadways, and road conditions, can be included in the simulation, and each may or may not also include locations, movement vectors, accelerations, and other simulated characteristics of the vehicle under test. For stationary features of the simulation, such as roadways, varying characteristics can include coefficient of friction for differing conditions (e.g., corresponding to rain, ice, hail, snow, etc.), or visibility for those same conditions and corresponding range limitations for various sensors. As another example, the simulation may include the sun, which can cause glare that affects stereo vision sensors, but does not affect LIDAR and Radar.

Further, this application refers to stimulation as generating a signal sent to a sensor that mimics the real-world environment that the sensor is designed to observe. The details of sensor stimulation can vary from sensor to sensor. However, one example is shown in reference to FIG. 10 and a Radar sensor. In this example, radio-frequency (RF) signals are sent to antennae of the Radar sensor that are designed to mimic objects of the simulated environment. In this way, the sensors receive the same or similar inputs from the stimulation generation module that they would from the real-world in that situation. Then, the Radar sensor's processing modules converts those stimulations to Radar output data, which is employed by the rest of the DPAV 602.

Further still, this application refers to emulation as generating a signal that bypasses the sensors themselves, and presents as output from the sensors processing modules. As an example and further described in reference to FIG. 10, this bypasses the antennae of the Radar sensor (or other sensors) and sends data directly to, for example, a sensor fusion processor (or other downstream system.

The stimulation generation module 636 generates stimulation data 640 that is sent to sensors of the sensor suite 604 (e.g., GPS, LIDAR, INS, Vision, Radar, Custom sensors, SVS, SDR (V2X), etc.). This is referred to as Hardware in a Loop (HWiL). The stimulation data 640 is directed to each sensor, and bypasses each sensor's physical means of sensing the world, instead supplying synthetic data meant to represent the world around them. Each sensor of the sensor suite 604 then processes the synthetic data as if it were data about the real world, and outputs sensor data to a sensor fusion processor 606.

The stimulation generation module 636 further can generate emulation data 642 that bypasses the sensors completely. This is referred to as Software in a Loop (SWiL). Instead of bypassing each sensor's acquisition systems, as in the stimulation example provided above, the stimulation generation module 636 sends emulation data 642 directly to the sensor fusion processor 606. The emulation data 642 is configured to appear to be the output of sensors from the sensor suite 604.

A person of ordinary skill in the art can recognize that the DPAV 602 can use exclusively stimulation data 640, exclusively emulation data 642, or a combination of both stimulation data 640 and emulation data 642. In particular, each sensor may exclusively use stimulation data 640 or emulation data 642, or a combination of stimulation data 640 and emulation data 642. A person of ordinary skill in the art can recognize that stimulation data 640 may be better suited for particular sensors, and emulation data 642 may be better suited for other sensors.

The DPAV 602 includes the sensor suite 604 (e.g., GPS, LIDAR, INS, Vision, Radar, Custom sensors, SVS, SDR (V2X), etc.) coupled to send outputs of its sensors to a sensor fusion processor 606. The sensor fusion processor 606 is further coupled to send its fused object list to a vehicle controller 610 and an infotainment system 612. The vehicle controller 608 further communicates with the car's mechanical systems 614 via a vehicle network bus 608.

The DPAV therefore can receive its stimulation data 640 at the sensor suite 604 and emulation data 642 at the sensor fusion processor. The stimulation data 640 and emulation data 642 should be synchronized to a common clock such that the sensor fusion processor 606 processes all data for the take time step of the simulation correctly. The DPAV 602 further receives electrical and mechanical stimulations 634 (e.g., acceleration, braking, steering, activation of other systems such as windshield wipers, etc.) at its mechanical systems module 614. Electrical/Mechanical emulation is further described by "Development of an Electric Vehicle Hardware-In-The-Loop Emulation Platform," by Mohon et al. in Proceedings of the ASME 2013 International Design Engineering Technical Conference and Computers and Information Engineering Conference, "Complete Automotive Electrical System Design", by R. Juchem & B. Knorr; in IEEE 2003 Vehicular Technology Conference; pp 3262-3266, and "Mechanical and Electrical Co-simulation Technology for In-Vehicle Power Systems," by K. Arai et al. in Sumitomo Electric.

The vehicle controller further outputs projected movements of the vehicle as well as the fused object list to the vehicle response simulator and display 638 of the sensor and communications stimulator server 630. The vehicle response simulator and display 638 generates a real-time view of the vehicle in the simulator, including renderings of the road around the car, the objects around the car, and the car's systems (e.g., steering wheel, accelerometer, etc.). This interface generates a visual rendering of a real-life traffic simulation for the autonomous vehicle.

By allowing for hooks between the sensor & communications stimulation server 630 and the sensor suite 604 and sensor fusion processor 606 of the DPAV 602, a designer can perform system debugging/verification via Virtual Reality (VR). The hooks artificially stimulate sensors and vehicle's communications system, such that in debugging, the signals can be modified to determine how the car would perform under different conditions.

Figure 7:
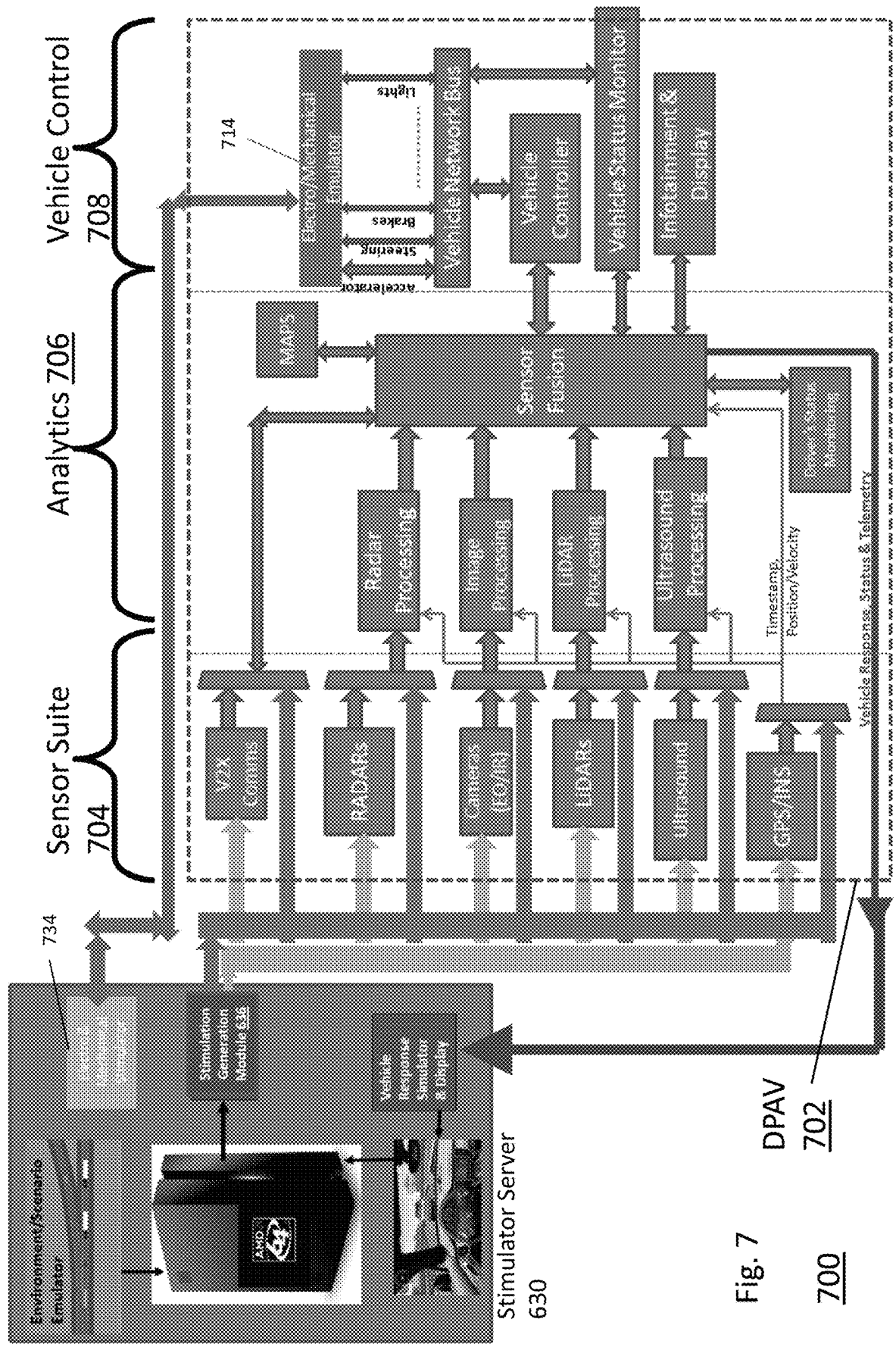
FIG. 7 is a diagram illustrating a simulation server and representation of a DPAV.

FIG. 7 is a diagram 700 illustrating a stimulator server 630 and representation of a DPAV 702. In this representation, the DPAV 702 is divided into three stages: (1) a sensor suite 704 including V2X Communications, RADAR(s), Camera(s) (EO/IR), LiDARs, Ultrasound, and GPS/INS; (2) an analytics stage 706 including RADAR processing, Image processing, LiDAR processing, Ultrasound processing, Driver's Status Monitoring, a Maps module/database, and a sensor fusion module; and (3) a vehicle control stage 708 including infotainment and display modules, a vehicle status monitor, a vehicle controller, a vehicle network bus, and an electro/mechanical emulator.

In the sensor suite 704, each of the individual sensors are connected to multiplexers (MUXes) that toggle between the output of each sensor having synthetic data stimulating its sensors and emulated data. The output of each MUX is output to the sensor fusion module, or if necessary, an intermediary processing module (e.g., RADAR processing, Image Processing, LiDAR processing, Ultrasound Processing), which in turn output their respective object lists to the sensor fusion module. With each MUX configured individually, each type of sensing input can be stimulated or emulated separately, and can change on demand by adjusting the control signal to each respective MUX. The sensor fusion module then relays the vehicle response, status and telemetry to the vehicle response simulator and display of the stimulator server 630.

The electro/mechanical emulator 714 further receives signals from the electro & mechanical stimulator 734 and sends signals to various car systems, such as the acceleration, steering, braking, lights, or other systems.

Figure 8:
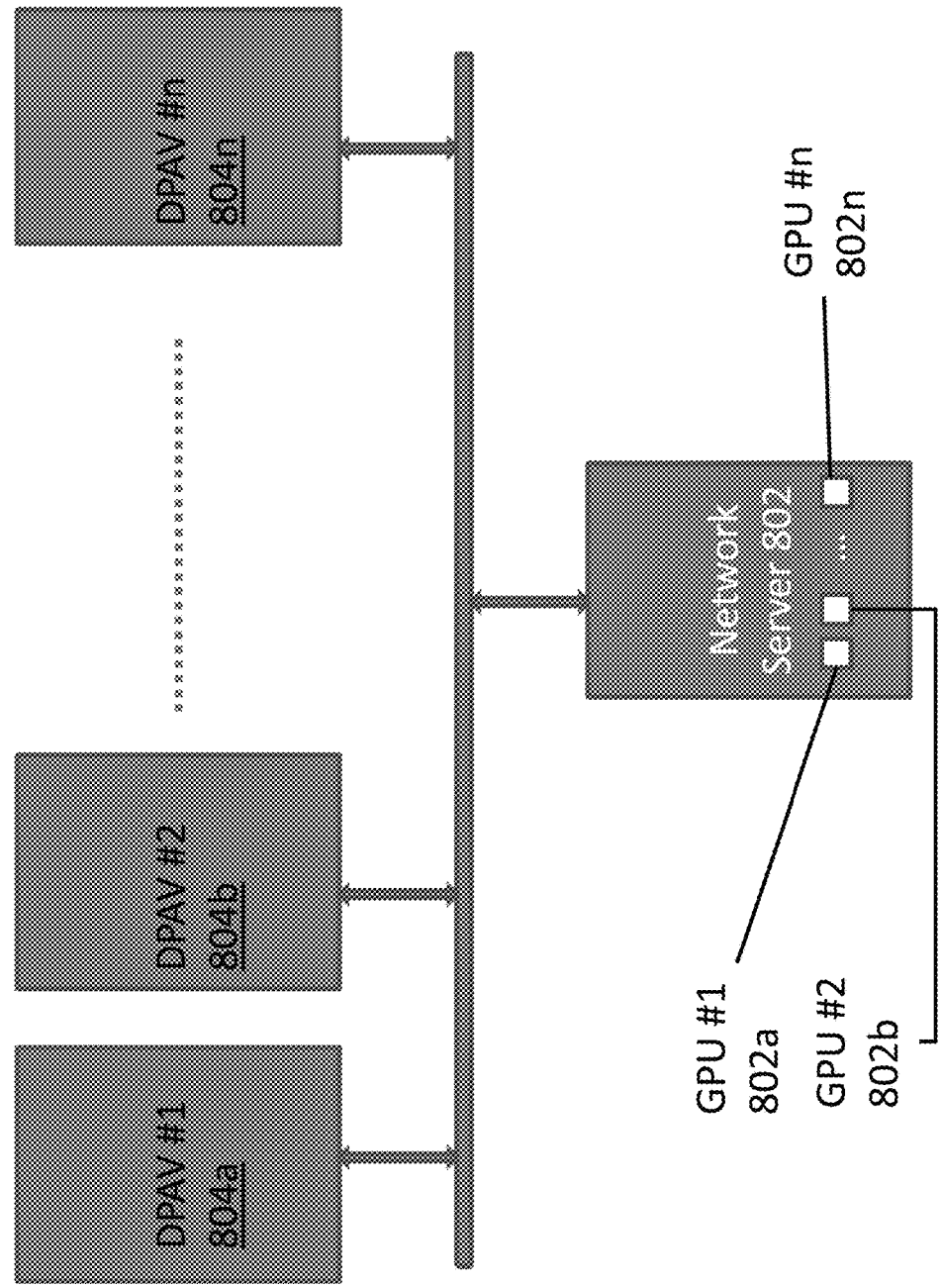
FIG. 8 is a block diagram illustrating an example embodiment of multiple DPAVs connected to a server over a network.

FIG. 8 is a block diagram 800 illustrating an example embodiment of multiple DPAVs 804a-n connected to a server 802 over a network. FIGS. 6 and 7 illustrate an example embodiment having one processing unit/GPU control one DPAV. However, in reference to FIG. 8, the network server 802 can enable multiple simulations to be executed at mutliple DPAVs. This provides an added advantage of increasing the number of simulations that can be run simultaneously, and thereby providing more simulated road data that can be used to refine the systems and methods of the autonomous vehicle. The network server 802 can include multiple GPUs 802a-n, however, a person of ordinary skill in the art can recognize that multiple simulations can be run on a single GPU, or that multiple GPUs can run a single simulation. In this way, a single server 804a-c (or in certain embodiments, multiple servers) can be configured to run multiple simulations that are executed by multiple DPAVs 804a-n.

Figure 9:
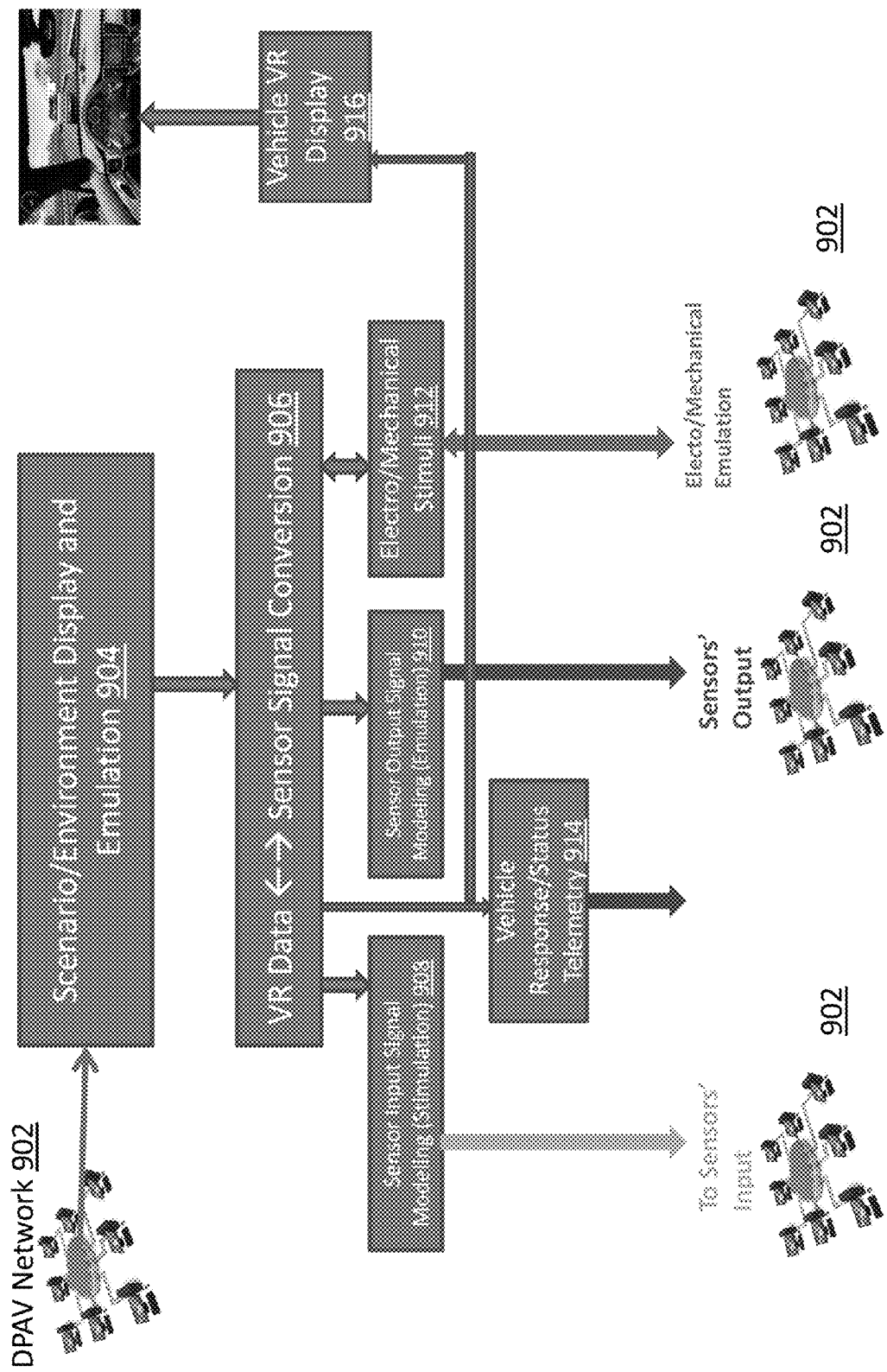
FIG. 9 is a block diagram illustrating an example embodiment of a DPAV network, as illustrated in FIG. 8, interfacing with systems of a scenario display and emulation module of a server.

FIG. 9 is a block diagram illustrating an example embodiment of a DPAV network 902, as illustrated in FIG. 8, interfacing with systems of a scenario display and emulation module 904 of a server. Instead of providing dimulations for one DPAV as shown in FIGS. 6-7, FIG. 9 illustrates an embodiment of simulation data being sent to one or more DPAVs of a DPAV network 902. A VR Data to sensor signal conversion module 906 converts object of the emulation to sensor signal stimulations or emulations. Sensor stimulations are sent to sensor inputs of the DPAV network 902 by a sensor input signal modeling module 908, and sensor emulations are sent to the DPAV network 902 by a sensor output signal modeling module 910. Each signal stimulation/emulation is sent to a respective DPAV of the DPAV network 902 corresponding to a particular simulation running at the emulation module 904.

Further, the sensor signal conversion 906 further generates an electro/mechanical stimuli module 912, which are sent to a respective DPAV of the DPAV network 902 corresponding to a particular simulation running at the emulation module 904.

The signal conversion module further communicates with a vehicle response/status telemetry module 914, which retrieves fused data from a respective DPAV of the DPAV network 902, and relays it to a vehicle VR display 916 to display the simulation.

Figure 10:
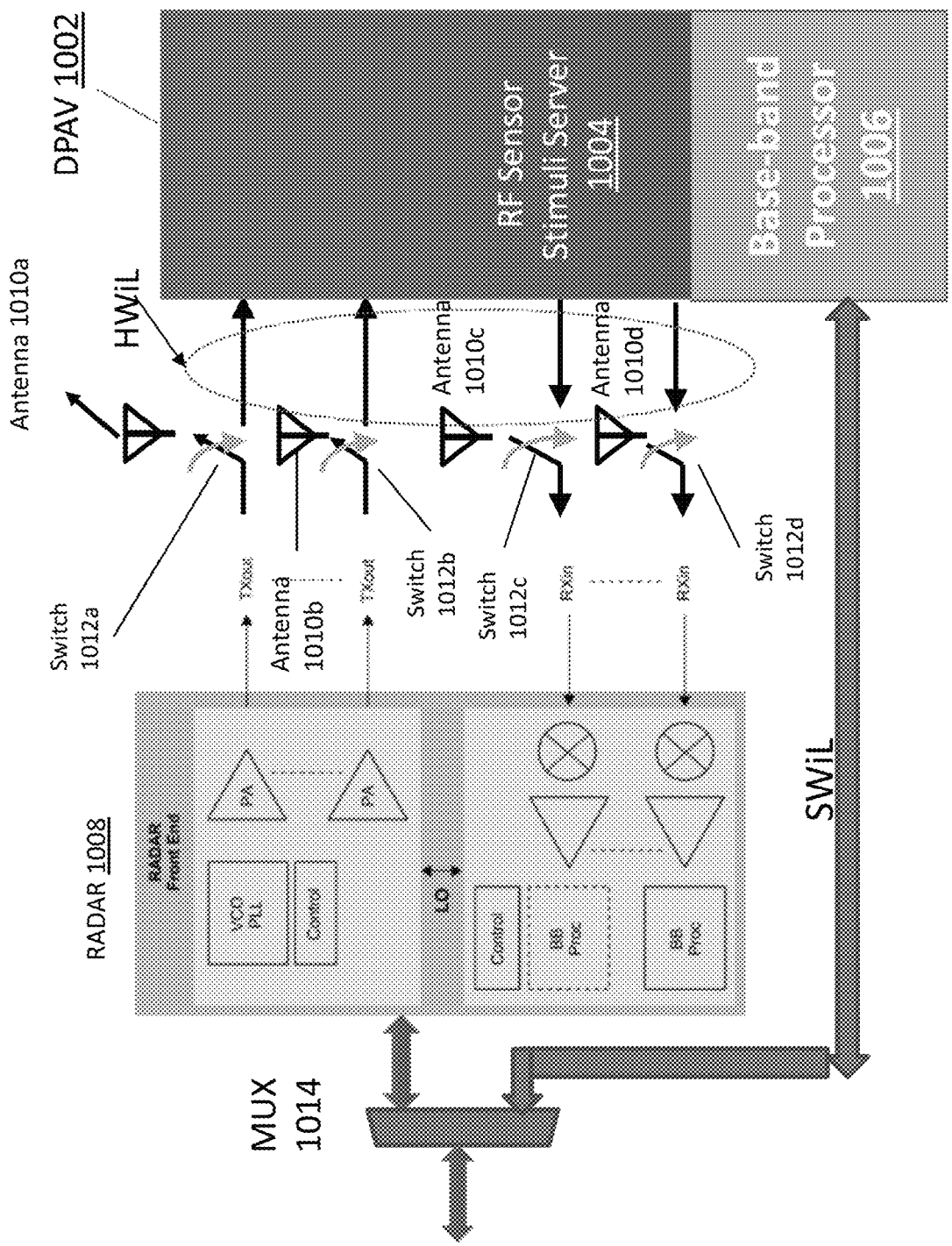
FIG. 10 is a block diagram illustrating an example embodiment of a DPAV interacting with an example RADAR sensor using both Hardware in a Loop (HWiL) and Software in a Loop (SWiL) simultaneously.

FIG. 10 is a block diagram illustrating an example embodiment of a DPAV 1002 interacting with an example RADAR sensor 1008 using both HWiL and SWiL simultaneously. An RF Sensor Stimuli Server 1004 generates stimuli to replace the RADAR's sensors, while a base-band processor generates emulated RADAR data.

Referring to the HWiL portion of this embodiment, traditionally, without stimulation from a simulator, the RADAR 1008 receives signals from antennae 1010a-d. A person of ordinary skill in the art can recognize a RADAR module can have other numbers of antennae, however. However, to implement stimulation of the RADAR module 1008, respective switches 1012a-d are coupled to select between the antennae 1010a-d and the RF sensor stimuli server 1004. When HWiL is activated, the switches 1012c-d allow the RF Sensor stimuli server 1004 to provide input signals to the RADAR 1008 that bypass Antennae 1010c-d ($RX_{IN}$), and the switches 1012a-b allow the RADAR 1008 to bypass antennae 1010a-b for its return transmission ($TX_{OUT}$). The RADAR 1008 then processes these stimulations as part of its normal operation. The RADAR 1008 believes the stimulations to be real-world observations representative of the environment, and does not need to be modified to process the signals. Further, the RF signals sent to the RADAR 1008 are verified and checked for required characteristics that are needed to achieve distance, ranging, and coverage set by the processor running the simulation.

On the other hand, a base-band processor 1006 can provide emulated signals that mimic the RADAR's output 1008. This can entirely bypass both the RADAR's antennae 1010a-d, but also the RADAR itself 1008. A Multiplexer (MUX) 1014 can then choose between HWiL and SWiL mode.

A person of ordinary skill in the art can recognize that modeling the environmental signals in the HWiL method are more accurate than emulating through software only. A person of ordinary skill in the art can further recognize that other sensors can be configured in similar ways by bypassing their direct environment sensors to receive synthetic data, and further by allowing a path for direct emulation with the MUX 1014 or other device.

Figure 11:
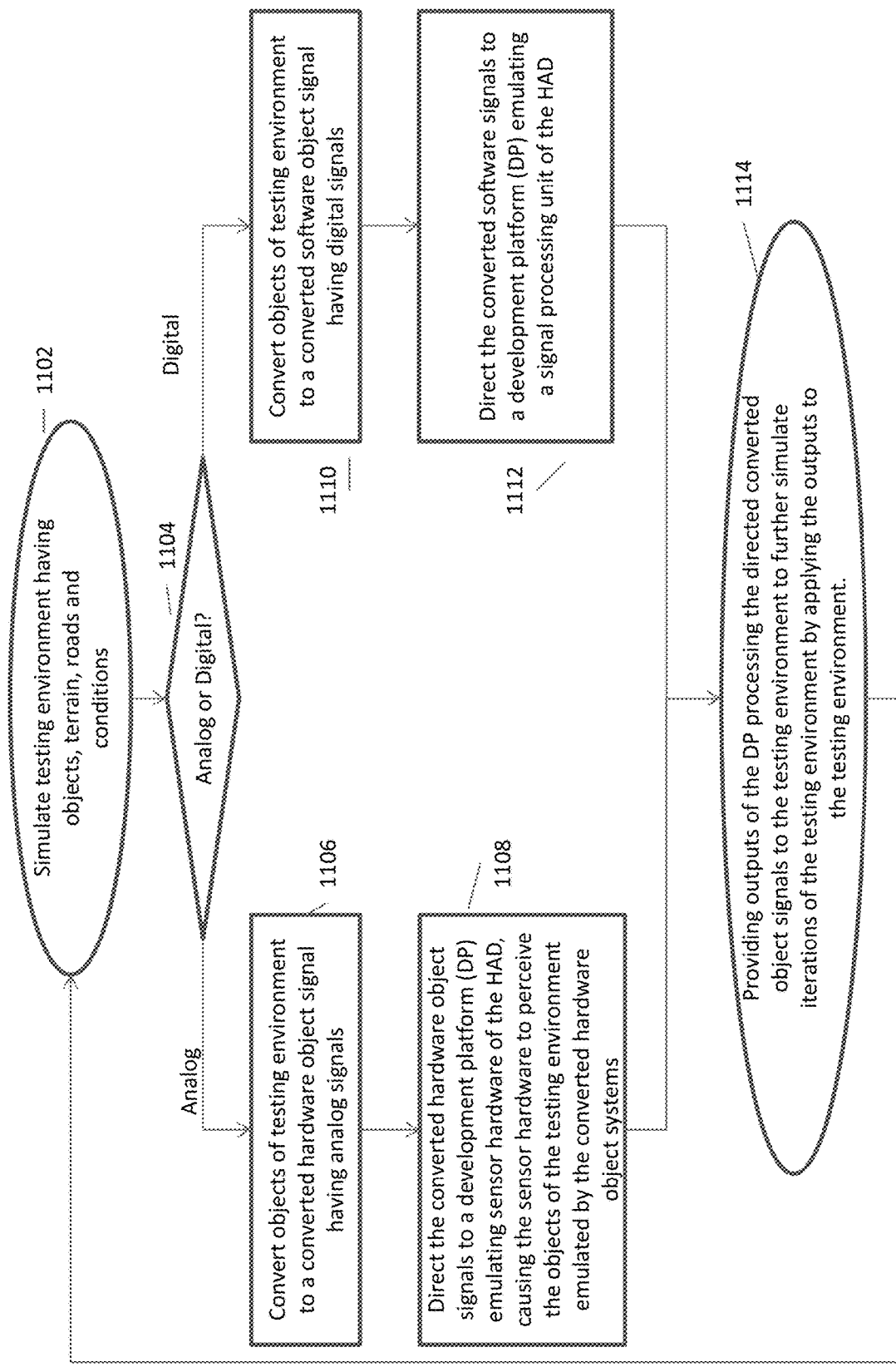
FIG. 11 is a flow diagram illustrating an example embodiment of a process employed by the present invention.

FIG. 11 is a flow diagram 1100 illustrating an example embodiment of a process employed by the present invention. The process simulates a testing environment having objects, terrain, roads and conditions, in one or more processors or GPUs (1102). Such a testing environment includes a simulation of the HAD vehicle under test, its road environment, objects such as trees, barriers, other vehicles, pedestrians, cyclists, or any other object that may be encountered by a HAD vehicle.

Then, the method can operate in either an analog or digital mode (1104). A person of ordinary skill in the art can recognize that certain systems of the HAD vehicle may only be able to operate in an analog or digital mode, and some may be able to operate in both, such as the RADAR system shown in FIG. 10. Certain systems of the HAD vehicle may be configured to only accept analog inputs or only accept digital input. If this is the case, the method appropriately directs the correct type of input to these systems. However, if the system is dual-modal, the system can choose which type of input to direct, or can take direction from a configuration file and/or user input of a user administering the test.

In an analog mode (1104), the method converts objects of the testing environment to a converted hardware object signal that have analog signals (1106). As described above in relation to FIG. 10, these synthetic analog signals emulate inputs to hardware sensors. In many scenarios, these analog signals are radio-frequency (RF) signals that the sensors would detect in the real world. However, the analog signals can be of other forms (e.g., ultrasonic, etc.).

The method then directs the converted hardware object signals to a development platform (DP) that emulates the sensor hardware of the highly automated driving (HAD) vehicle (1108). This directs the hardware object signals to the sensor hardware, by passing the sensing instruments of the sensor hardware itself and providing the analog signals that those sensing instruments usually provide. The remaining hardware and software of the sensor hardware processes the analog signals and provides an output from the hardware sensor.

In a digital mode (1104), the method converts objects of the testing environment to a converted software object signal having digital signals (1110). Unlike the analog mode, in digital mode the signals do not emulate the RF or other real-world signals, but instead directly emulate the output of the hardware sensors. These signals are directed to signal processing units of the HAD vehicle emulated by the DP (1112).

Whether analog or digital, the outputs (1108, 1112) are then provided back to the testing environment to further simulate iterations of the testing environment (1114). The outputs collectively update the position of the vehicle within the simulation (e.g., from an IMU system), the objects that the car sees (e.g., from RADAR/LIDAR/SVS), etc. The simulation is then updated with the car's knowledge of the world and the car's updated position, velocity, acceleration, and/or any other car-subsystem status, and another iteration of the simulation is run at a next time-step. The testing then continues by converting the updated objects to updated object signals (1106, 1110), which are directed to respective systems on the DPs (1106, 1110).

Figure 12:
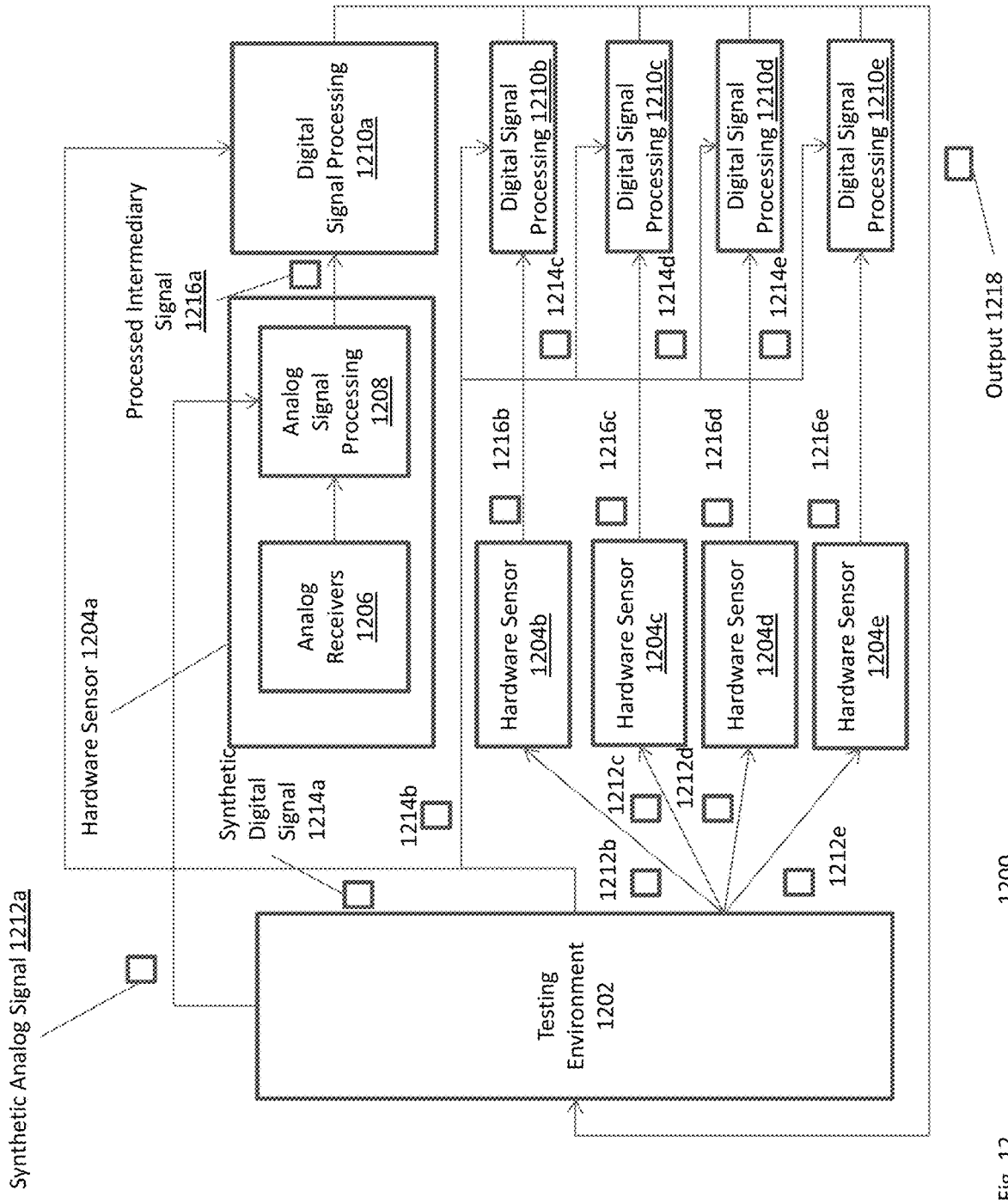
FIG. 12 is a block diagram illustrating an example embodiment of a system employed by the present invention.

FIG. 12 is a block diagram 1200 illustrating an example embodiment of a system employed by the present invention. A testing environment 1202, simulated by one or more processors or GPUs, generates objects representing roads, roadways, terrain, weather conditions, etc. The testing environment converts these to either synthetic analog signals 1212a-e or synthetic digital signals 1214a-e.

In the analog example, a synthetic analog signal 1212a is sent to a hardware sensor 1204a directly to an analog signal processing module 1208 of the hardware signal processing 1208. The synthetic analog signal 1212a emulate inputs to hardware sensors such as hardware sensor 1204a. In many scenarios, these analog signals are radio-frequency (RF) signals that the sensors would detect in the real world. However, the analog signals can be of other forms (e.g., ultrasonic, etc.). The analog signal processing 1208 process the raw synthetic analog signal 1212a representing, for example, RF signals in the real world, to a processed intermediary signal 1216a that is forwarded to a digital signal processing module 1210a. The digital signal processing module 1210a can perform a variety of tasks, such as object fusion or localization, with the processed intermediary signal 1216a. The output 1218, including for example an updated object list or other output, is then sent back to the testing environment 1202 to be used in a next iteration/time-step of the simulation.

A person of ordinary skill in the art can recognize that analog signals 121b-e can be sent to analog signal processing units of respective hardware sensors 1204b-e in the same manner. Each hardware sensor 1204b-e can generate respective processed intermediary signals 1216b-e to be sent to respective digital signal processing modules 1210b-e. Each digital signal processing module 1210b-e generates a respective output 1218 that is then sent to the testing environment 1202.

In the digital example, the testing environment generates a synthetic digital signal 1214a that is sent directly to the digital signal processing module 1210a, which operates as described above. In other words, the synthetic digital signal 1214a is sent to the digital signal processing 1210a instead of the processed intermediary signal 1216a that is derived from the synthetic analog signal 121a. As a result, the hardware sensor 12104a is bypassed entirely, and the output of the entire hardware sensor 1204a is emulated. The digital signal processing 1210a determines what to do with the emulated hardware sensor output (e.g., the synthetic digital signal 1214a) by fusing objects, etc. The output 1218 of the digital signal processing unit 1210a is sent to the testing environment to run further iterations of the simulation.

A person of ordinary skill in the art can further recognize that the other hardware sensors 1204b-e can be bypassed by respective synthetic digital signals 1214b-e being sent to respective digital signal processing units 1210b-e. Each digital signal processing unit 1210b-e then generates a respective output 1218 that is forwarded to the testing environment 1202.

Therefore, a person of ordinary skill in the art can recognize that in either the analog or digital example, multiple hardware sensors can be emulated by either an analog or digital signal, and the testing simulation can iteratively continue with the outputs of each processing system.

Figure 13:
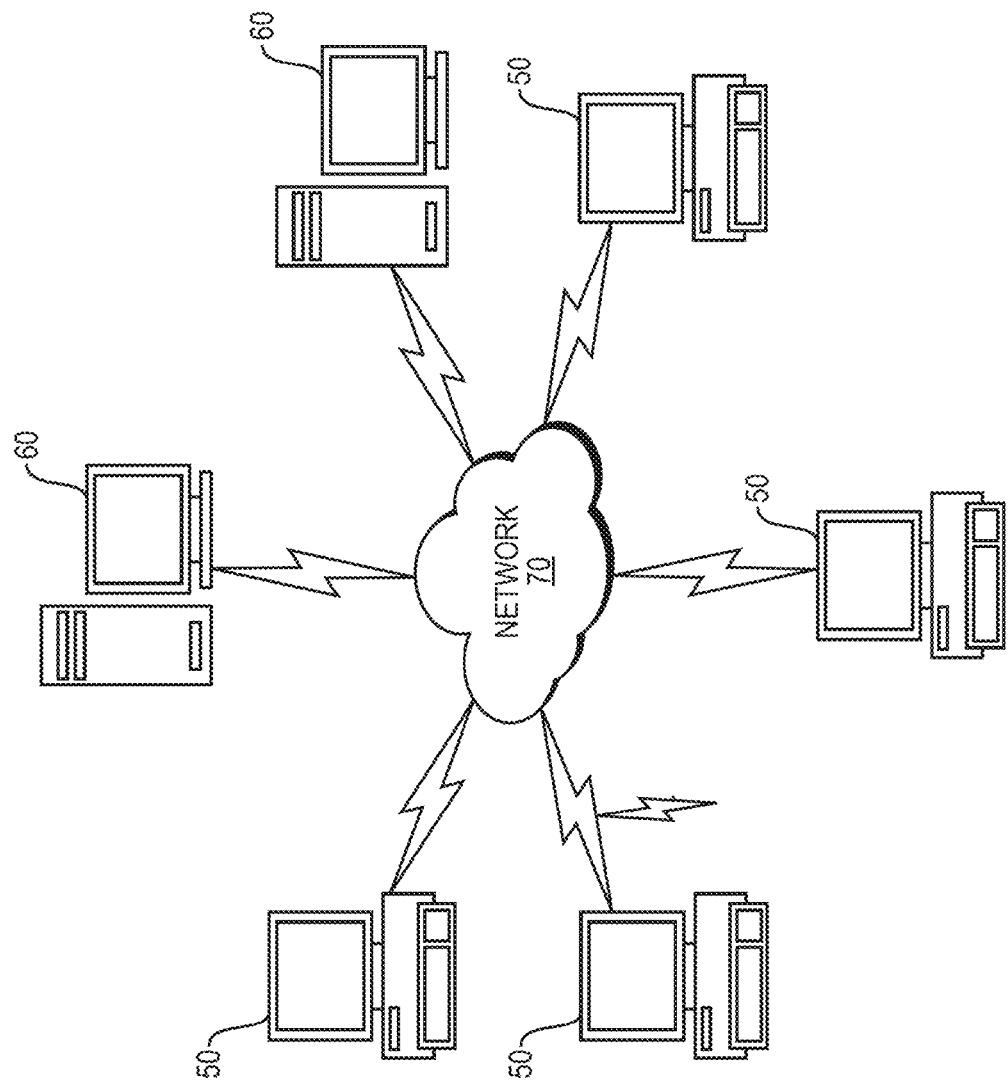
FIG. 13 illustrates a computer network or similar digital processing environment in which embodiments of the present invention may be implemented.

FIG. 13 illustrates a computer network or similar digital processing environment in which embodiments of the present invention may be implemented.

Client computer(s)/devices 50 and server computer(s) 60 provide processing, storage, and input/output devices executing application programs and the like. The client computer(s)/devices 50 can also be linked through communications network 70 to other computing devices, including other client devices/processes 50 and server computer(s) 60. The communications network 70 can be part of a remote access network, a global network (e.g., the Internet), a worldwide collection of computers, local area or wide area networks, and gateways that currently use respective protocols (TCP/IP, Bluetooth®, etc.) to communicate with one another. Other electronic device/computer network architectures are suitable.

FIG. 14 is a diagram of an example internal structure of a computer (e.g., client processor/device 50 or server computers 60) in the computer system of FIG. 13. Each computer 50, 60 contains a system bus 79, where a bus is a set of hardware lines used for data transfer among the components of a computer or processing system. The system bus 79 is essentially a shared conduit that connects different elements of a computer system (e.g., processor, disk storage, memory, input/output ports, network ports, etc.) that enables the transfer of information between the elements. Attached to the system bus 79 is an I/O device interface 82 for connecting various input and output devices (e.g., keyboard, mouse, displays, printers, speakers, etc.) to the computer 50, 60. A network interface 86 allows the computer to connect to various other devices attached to a network (e.g., network 70 of FIG. 9). Memory 90 provides volatile storage for computer software instructions 92 and data 94 used to implement an embodiment of the present invention (e.g., environment/scenario emulator, electro & mechanical stimulator, sensor and communication stimulator, vehicle response simulator and display above). Disk storage 95 provides non-volatile storage for computer software instructions 92 and data 94 used to implement an embodiment of the present invention. A central processor unit 84 is also attached to the system bus 79 and provides for the execution of computer instructions.

In one embodiment, the processor routines 92 and data 94 are a computer program product (generally referenced 92), including a non-transitory computer-readable medium (e.g., a removable storage medium such as one or more DVD-ROM's, CD-ROM's, diskettes, tapes, etc.) that provides at least a portion of the software instructions for the invention system. The computer program product 92 can be installed by any suitable software installation procedure, as is well known in the art. In another embodiment, at least a portion of the software instructions may also be downloaded over a cable communication and/or wireless connection. In other embodiments, the invention programs are a computer program propagated signal product embodied on a propagated signal on a propagation medium (e.g., a radio wave, an infrared wave, a laser wave, a sound wave, or an electrical wave propagated over a global network such as the Internet, or other network(s)). Such carrier medium or signals may be employed to provide at least a portion of the software instructions for the present invention routines/program 92.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A method for testing a highly-automated driving (HAD) vehicle, the method comprising:
   simulating a testing environment, by at least one processor, the testing environment including any of a plurality of objects, terrain, roadways, and road conditions;
   converting, by the at least one processor, the objects of the testing environment to converted object signals, the converted object signals comprising at least one of:
   (a) a converted hardware object signal having synthetic analog signals emulating objects of the testing environment, and
   (b) a converted software object signal having synthetic digital signals emulating the objects of the testing environment;
   directing the converted object signals to a development platform (DP) emulating systems of the HAD vehicle by:
   (i) directing the converted hardware object signals to sensor hardware of the HAD vehicle, causing the sensor hardware to perceive the objects of the testing environment emulated by the converted hardware object signals, and
   (ii) directing the converted software object signals to at least one signal processing unit of the HAD vehicle; and
   providing outputs of systems of the DP processing the directed converted object signals to the testing environment to further simulate iterations of the testing environment, at the at least one processor, by applying the outputs to the testing environment.

2. The method of claim 1, wherein converting the objects of the testing environment to converted signals further includes converted object signals comprising: (c) electrical/mechanical (E/M) emulation signals;
   wherein directing the converted hardware object signals to systems of the DP further includes: (iii) directing the converted E/M signals to an electro/mechanical emulator.

3. The method of claim 1, wherein directing the converted hardware object signals to sensor hardware of the DP further includes bypassing a sensor of the sensor hardware to provide physics-based synthetic data to the sensor hardware.

4. The method of claim 1, wherein directing the converted software object signals to the signal processing units of the DP bypasses the sensor hardware.

5. The method of claim 1, wherein a multiplexer chooses between a type of converted object signals to send to the signal processing units.

6. The method of claim 1, further comprising:
   generating a display of the testing environment, the display being a real-time video of a highly-autonomous vehicle of the DP under test and the testing environment.

7. The method of claim 1, wherein simulating includes simulating a plurality of testing environments,
   converting includes converting the objects of the testing environment to converted object signals for each of the plurality of testing environments, and
   directing includes directing the converted object signals to a respective DP of a plurality of DPs.

8. The method of claim 1, wherein the analog signals are radio frequency (RF) signals.

9. The method of claim 1, wherein the at least one processors are graphical processing units (GPUs).

10. A system for testing a highly-automated driving (HAD) vehicle, the system comprising:
    a processor; and
    a memory with computer code instructions stored therein, the memory operatively coupled to said processor such that the computer code instructions configure the processor to implement:
    simulating a testing environment, by the processor, the testing environment including any of a plurality of objects, terrain, roadways, and road conditions;
    converting, by the processor, the objects of the testing environment to converted object signals, the converted object signals comprising at least one of:
    (a) a converted hardware object signal having synthetic analog signals emulating objects of the testing environment, and
    (b) a converted software object signal having synthetic digital signals emulating objects of the testing environment;
    directing the converted object signals to a development platform (DP) emulating systems of the HAD vehicle by:
    (i) directing the converted hardware object signals to sensor hardware of the HAD vehicle, causing the sensor hardware to perceive the objects of the testing environment emulated by the converted hardware object signals, and
    (ii) directing the converted software object signals to at least one signal processing units of the HAD vehicle; and
    providing outputs of systems of the DP processing the directed converted object signals to the testing environment to further simulate iterations of the testing environment, at the processor, by applying the outputs to the testing environment.

11. The system of claim 10, wherein converting the objects of the testing environment to converted signals further includes converted object signals comprising: (c) electrical/mechanical (E/M) emulation signals;
    wherein directing the converted hardware object signals to systems of the DP further includes: (iii) directing the converted E/M signals to an electro/mechanical emulator.

12. The system of claim 10, wherein directing the converted hardware object signals to sensor hardware of the DP further includes bypassing a sensor of the sensor hardware to provide physics-based synthetic data to the sensor hardware.

13. The system of claim 10, wherein directing the converted software object signals to the signal processing units of the DP bypasses the sensor hardware.

14. The system of claim 10, wherein a multiplexer chooses between a type of converted object signals to send to the signal processing units.

15. The system of claim 10, wherein the at least one processor are graphical processing units (GPUs).

16. The system of claim 10, further comprising:
    generating a display of the testing environment, the display being a real-time video of the DP vehicle under test and the testing environment.

17. The system of claim 10, wherein simulating includes simulating a plurality of testing environments,
    converting includes converting the objects of the testing environment to converted object signals for each of the plurality of testing environments, and
    directing includes directing the converted object signals to a respective DP of a plurality of DPs.

18. The system of claim 10, wherein the analog signals are radio frequency (RF) signals.

19. A non-transitory computer-readable medium configured to store instructions for testing a highly-automated driving (HAD) vehicle, the instructions, when loaded and executed by a processor, causes the processor to:
- simulate a testing environment, by the processor, the testing environment including any of a plurality of objects, terrain, roadways, and road conditions;
- convert, by the processor, the objects of the testing environment to converted object signals, the converted object signals comprising at least one of:
  - (a) a converted hardware object signal having synthetic analog signals emulating objects of the testing environment, and
  - (b) a converted software object signal having synthetic digital signals emulating the objects of the testing environment;
- direct the converted object signals to a development platform (DP) emulating systems of the HAD vehicle by:
  - (i) directing the converted hardware object signals to sensor hardware of the HAD vehicle, causing the sensor hardware to perceive the objects of the testing environment emulated by the converted hardware object signals, and
  - (ii) directing the converted software object signals to signal processing units of the HAD vehicle; and
- provide outputs of systems of the DP processing the directed converted object signals to the testing environment to further simulate iterations of the testing environment, at the processor, by applying the outputs to the testing environment.

20. The non-transitory computer readable medium of claim 19, wherein converting the objects of the testing environment to converted signals further includes converted object signals comprising: (c) electrical/mechanical (E/M) emulation signals;
- wherein directing the converted hardware object signals to systems of the DP further includes: (iii) directing the converted E/M signals to an electro/mechanical emulator.

* * * * *